United States Patent
Abtahi et al.

[11] Patent Number: 5,890,794
[45] Date of Patent: Apr. 6, 1999

[54] LIGHTING UNITS

[76] Inventors: Homayoon Abtahi; Maria Fernanda Abtahi, both of 2649 NW. 28th Ter., Boca Raton, Fla. 33434

[21] Appl. No.: 627,119

[22] Filed: Apr. 3, 1996

[51] Int. Cl.⁶ .............................. F21V 29/00; F21L 9/00
[52] U.S. Cl. .................... 362/294; 362/183; 362/184; 362/249; 362/373; 362/267; 362/800
[58] Field of Search ....................... 362/218, 235, 362/240, 244, 158, 249, 252, 184, 267, 185, 800, 101, 318, 294, 373

[56] References Cited

U.S. PATENT DOCUMENTS

| | | | |
|---|---|---|---|
| 4,271,458 | 6/1981 | George, Jr. ............................ | 362/249 |
| 5,065,291 | 11/1991 | Frost et al. ............................ | 362/183 |
| 5,224,773 | 7/1993 | Arimura ................................ | 362/227 |
| 5,237,490 | 8/1993 | Ferng ................................... | 362/185 |
| 5,585,783 | 12/1996 | Hall ....................................... | 362/800 |
| 5,630,660 | 5/1997 | Chen ..................................... | 362/184 |
| 5,688,042 | 11/1997 | Madadi et al. ....................... | 362/800 |

*Primary Examiner*—Thomas M. Sember
*Attorney, Agent, or Firm*—Ronald V. Davidge

[57] ABSTRACT lighting unit includes a circuit board having a number of LED packages extending outward from a front side. The printed circuit board is covered by a transparent cover, forming an outer cavity between the cover and the printed circuit board. The printed circuit board is supported by a housing, in which a second cavity is formed. In a first embodiment, the circuit board, being flexible, is wrapped around a cylindrical housing, with LED packages being directed radially outward. In a second embodiment, the circuit board is rigid, with LED packages being aligned in a common outward direction. In either embodiment, the outer cavity may be filled with a fluid used to promote cooling the LED packages.

4 Claims, 5 Drawing Sheets

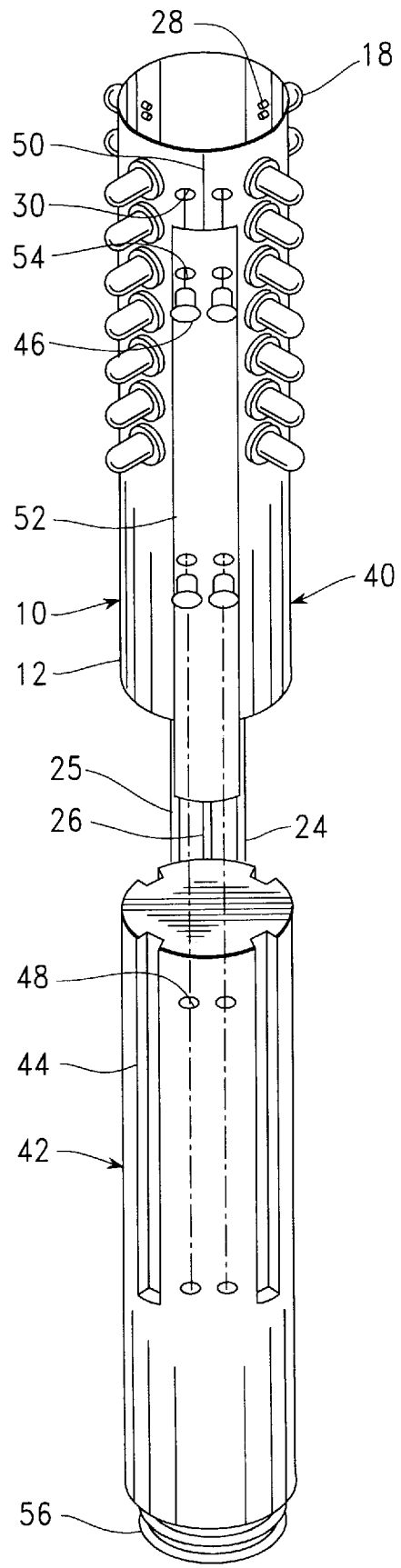
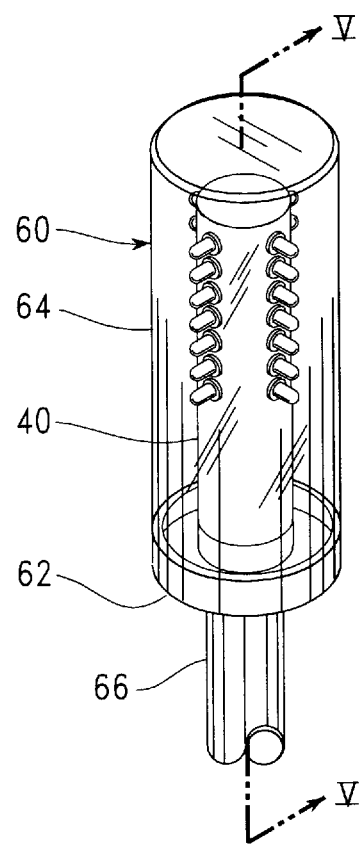
FIG. 4.
FIG. 3.

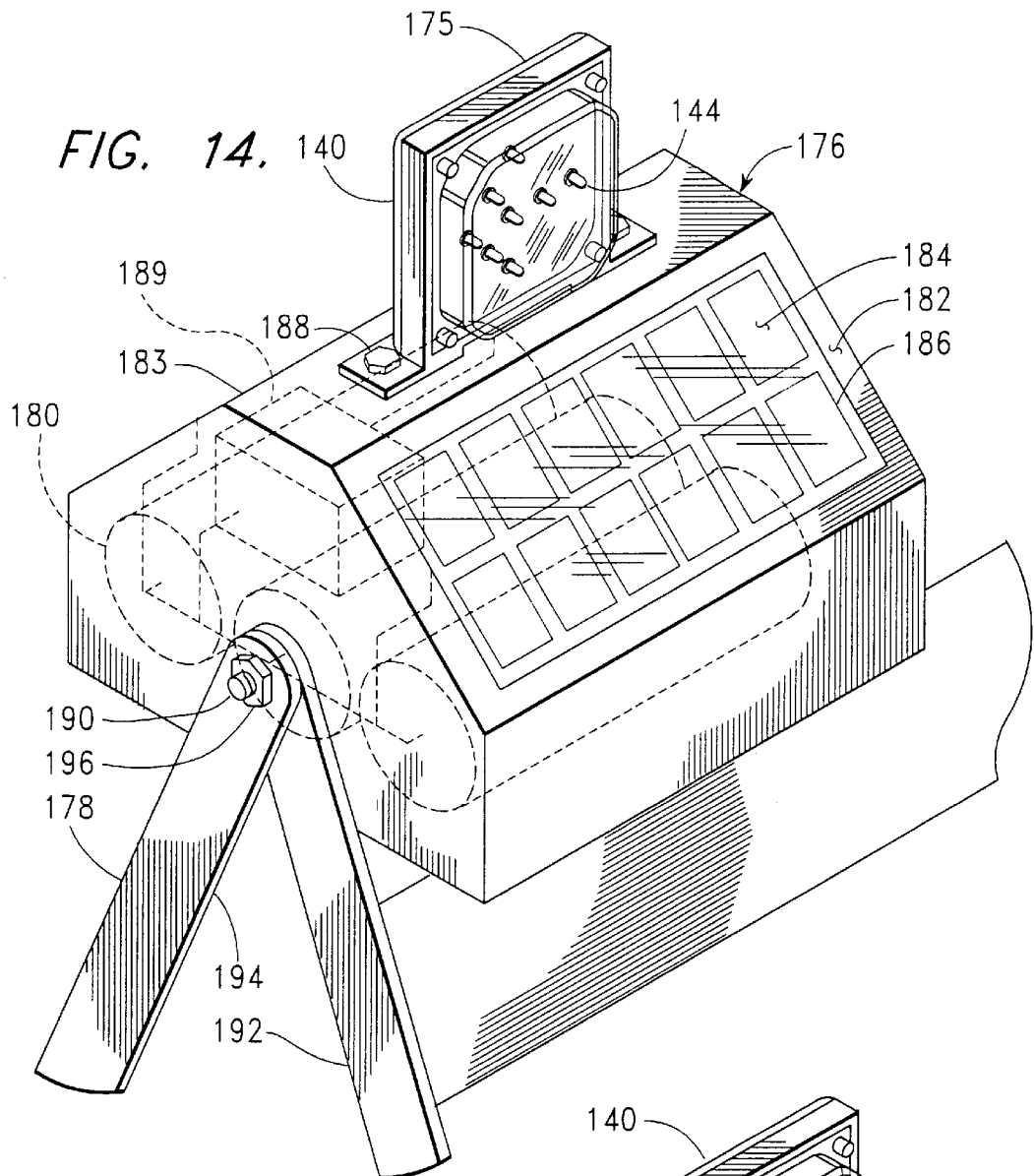
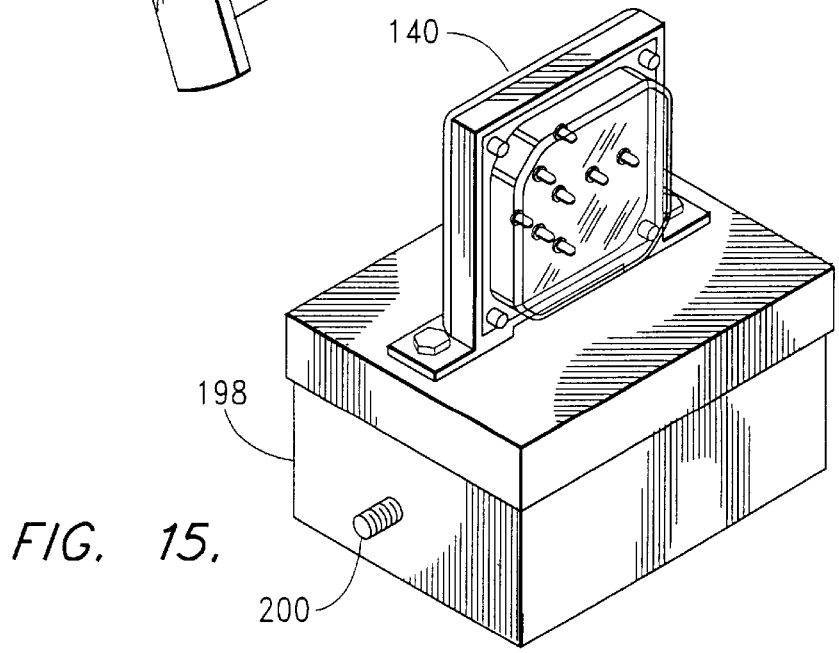

LIGHTING UNITS

BACKGROUND OF THE INVENTION

1. Field of the Invention

This invention relates to lighting units employing LED (light emitting diode) packages and, more particularly, to beacon lights having LED packages extending radially outward from a cylindrical surface, and to display lights using individual LED packages to display a coherent image.

2. Background Information

Stationary lighting units are used for a number of important purposes, many of which require the placement of a light at a remote location where electrical service is non-existent and where the replacement of batteries used to operate the light is, at best, difficult and expensive. Examples of such applications are beacon lights placed along waterways to indicate buoy locations, navigational hazards, such as rock formations, and dock facilities. In such applications, the visible color and timing (i.e. whether the light is flashing and the sequence of flashes) is determined by the specific use of the light, with specific requirements for lights placed along navigable waterways being determined by government agencies, such as the U.S. Coast Guard. Such lights are generally incandescent types, which are powered, for example, by re-chargeable batteries operating the lights at night and being recharged using solar cells during the day.

Another common use of stationary lighting units is exemplified by flashing yellow warning lights placed along roadways to indicate construction areas and other locations causing traffic to be rerouted or, at least, to be warned away from a hazard, such as road edge next to a steep drop-off. A light of this type is generally configured as an integral unit, including a battery and electronics to provide the flasher function, along with a reflector and fresnel lens forming a housing around an incandescent lamp. Such an integral is typically clamped to a movable barricade, which is placed with other barricades around or along the hazard from which motorists are to be warned.

Two particular disadvantages of using incandescent lamps in applications of this type are the electrical current required and the frequent need for replacing lamps which burn out. The electrical current requirements of the lamp determine that a relatively large battery is required for the application, and that, if the battery is to be recharged during use, as in the marine navigational examples, the photovoltaic cells used to produce current for recharging must be relatively large. What is needed is a lighting system including a sufficiently-visible array of LEDs (Light Emitting Diodes), which typically use much less electrical energy than incandescent lamps. Furthermore, LEDs, since they are far more efficient than incandescent lamps, produce much less heat, allowing their use within and adjacent to plastic optical elements. In typical applications, LEDs last several times as long as incandescent lamps.

While most commercially-available LEDs are built using a single light-emitting chip integrated into a package with a single plastic lens through which light from the chip is refracted, cluster LEDs have been built with a number of segments extending outward from a cylindrical surface. Each such segment includes a light-emitting chip and a plastic lens structure.

DESCRIPTION OF THE PRIOR ART

U.S. Pat. No. 5,224,773 to Arimura describes a beacon lantern using many LEDs (Light Emitting Diodes), radially distributed on a horizontal circumference, as a light source. A cylindrical fresnel lens, which is made by rolling a sheet-like, fine-prism shaped fresnel lens into the shape of a cylinder, converges beams of light in all horizontal directions. The lantern maintains a top lid and a lower lantern body with a prescribed distance therebetween by means of a center bolt extending between the lid and the lower lantern body. Arimura uses a number of LEDs, each of which points radially outward, extending around a circular circumference. An LED of this type typically includes a spherically rounded lens molded into the end of a plastic structure extending outward from the light-producing chip. This lens serve to concentrate the light emitted by the light-producing chip, reducing the angle through which light is emitted outside the LED. Since the lens is spherical, light is generally emitted within a cone extending, and expanding, outward from the end of the LED. Arimura further condenses the light vertically, so that more light is emitted from his beacon horizontally, through the use of his fresnel lens.

However, each of the devices described by Arimura includes a number of LEDS extending around the circumference of a base plate. This type of structure fails to take advantage of the mass production processes which have been developed for automatic placement of LEDS and other electronic device packages on a circuit board. What is needed is a configuration providing radially outward facing LEDS which have been placed on a circuit board by such a process.

Also, a typical commercially-available LED emits light in directions not extending through the molded lens at the end of the plastic structure. Such light comes, for example, strongly through the side of the plastic structure. What is needed is a beacon light configuration taking advantage of this light not travelling through the lens at the end of the plastic structure, thereby allowing the use of fewer LEDs and less electrical power to produce a satisfactory viewable image.

Furthermore, each of the devices described by Arimura includes a number of LEDS mounted centrally within a sealed container having a light transmitting cylindrical outer surface. Thus, the rate at which LEDS are cooled is limited by the ability to transfer heat through the still air around the LEDS. What is needed is an improved method for cooling LEDS within a beacon light, so that they may be run for long lifetimes at the relatively high electrical currents needed for a high-intensity light output.

U.S. Pat. No. 5,065,291 to Frost, et al. describes a solar-powered light in which illumination from a single LED is diffused through a lens with a textured surface, causing the lens to appear to glow. A number of lights of this kind can be used to mark a predetermined boundary. In this unit, the single LED is fastened to a printed circuit board.

However, the light available from the Frost device is limited by the use of a single LED. In a beacon light application, many LEDS are needed to establish sufficient light output. In a display light application, what is needed is a way to provide individual points of light making up a coherent image.

SUMMARY OF THE INVENTION

In accordance with one aspect of the invention, there is provided a lighting unit including a circuit board assembly, a number of LED packages, a transparent cover, a housing, and a number of circuit wires. The circuit board assembly has an insulating substrate with an outer side and an inner side, opposite the outer side. A number of conductive circuit lands extend along the inner side. Leads from the LED packages extend through holes in the insulating substrate, being individually soldered to the conductive circuit lands. Each LED package includes a light-emitting segment in a base portion, a light-transmitting portion extending from the base portion along an optical axis of the LED package, and a lens portion at an end of the light transmitting portion to direct light from the light-emitting segment away from the LED package. Each LED package is mounted with its optical axis extending outward for the outer side, being perpendicular to the outer side. The transparent cover extends outwardly adjacent to the LED packages, with a first cavity between the transparent cover and the LED packages being sealed from ambient air (i.e. from the air surrounding the lighting unit). The housing extends from the inner side, with the circuit board assembly being attached to, and supported by, the housing. A second cavity within the housing is also sealed from ambient air. The circuit wires, which are individually attached to various of the circuit lends, extend outward through a hole in the housing.

In one embodiment of the present invention, the housing has a generally cylindrical outer surface and a generally cylindrical inner surface, extending around the second cavity. The insulating substrate is flexible and is curved around the generally cylindrical outer surface, with the optical axis of each LED package extending outward radially from the outer surface of the substrate. A base extends outward from a first end of the housing, which is attached to the base. The transparent cover has a cylindrical portion extending around the circuit board and LED packages from a peripheral portion of the base, and an end cover portion extending across a second end of the housing.

In an alternate embodiment of the present invention, the insulating substrate is rigid and flat, with the optical axis of each LED package extending in a common direction perpendicular to the outer side.

BRIEF DESCRIPTION OF THE DRAWINGS

FIG. 3 is an exploded isometric view of an intermediate assembly including the circuit board of FIG. 1;

FIG. 4 is an isometric view of a beacon light built in accordance with the present invention, including the intermediate assembly of FIG. 3;

FIG. 14 is a partial isometric view of a warning system including the display light of FIG. 11, a power supply having batteries recharged by solar energy, and a folding barricade; and FIG. 15 an isometric view of the display light of FIG. 11 attached to a power supply including a replaceable battery.

DETAILED DESCRIPTION

Figure 1:
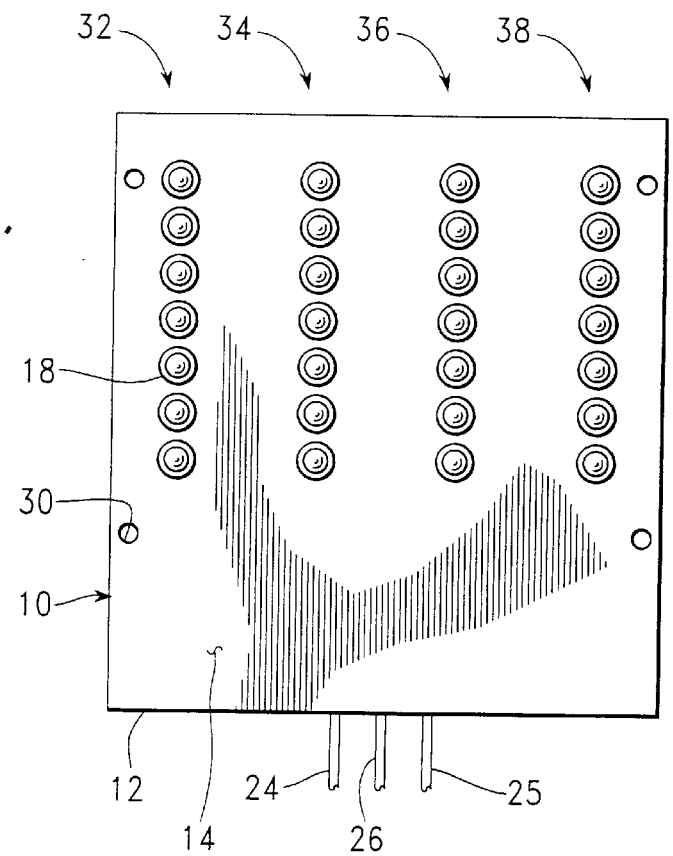
FIG. 1 is a plan view of a flexible circuit board assembly, built in accordance with an embodiment of the present invention, having a number of LED packages for use in a beacon light.

A flexible printed circuit assembly built according to the present invention for use in a beacon light, will now be discussed, with particular reference being made to FIGS. 1 and 2. FIG. 1 is a plan view of the circuit assembly, while FIG. 2 is an underneath plan view thereof.

Figure 2:
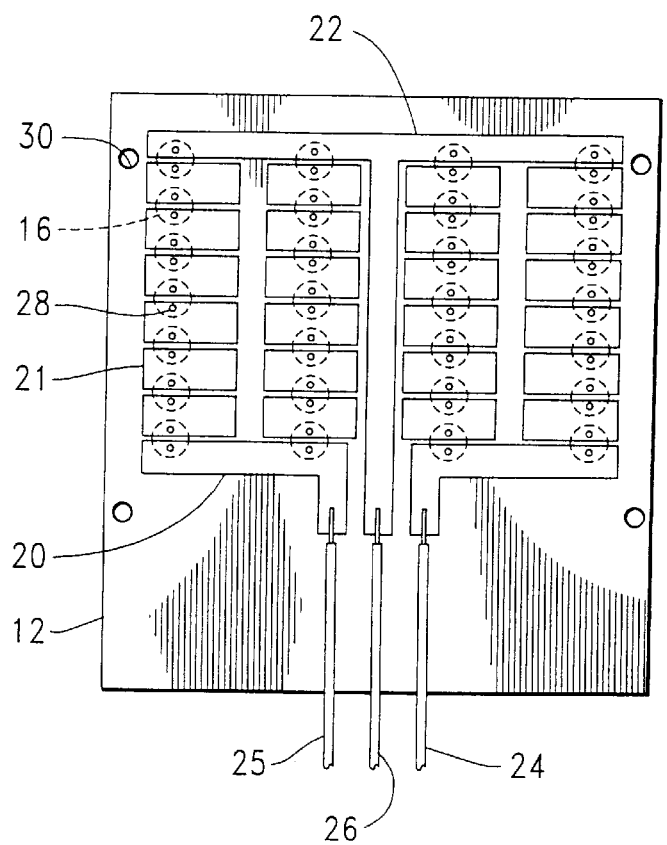
FIG. 2 is an underneath plan view of the circuit board assembly of FIG. 1.

Thus, referring to FIGS. 1 and 2, a flexible printed circuit assembly 10 includes a flexible insulating substrate 12 having, on each side, a conductive coating, such as a copper layer. The upper-side conductive layer 14 has a circular void 16 at each position where an LED package 18 is to be placed. The remaining portion of conductive layer 14 is continuous across the upper side of the substrate 12. The under-side conductive layer consists of a number of conductive circuit lands 20, 21, 22. These patterns in the conductive layers are composed, for example, of portions remaining when the rest of each conductive layer is etched away using a process well known to those skilled in the art of manufacturing printed circuit boards. A drive wire 24, 25 is attached to each "L"-shaped circuit land 20, while a common wire 26 is attached to the "T"-shaped common circuit land 22. At each position where an LED package 18 will be attached, a pair of holes extend trough the substrate 12 to accept a pair of leads 28 extending from the LED package 18. A number of mounting holes 30 also extend through the substrate 12. The substrate 12 also includes a number of mounting holes 30 extending therethrough.

In the process of building the flexible circuit board assembly 10 the LED packages 18 are placed on the front side of the substrate 12, which has been prepared, as described above, to include holes and conductive layers. A conventional automatic pick-and-place mechanism may be used to place the LED packages 18 with their leads 28 extending through corresponding holes in the substrate 12. The leads 28 are next soldered to the individual circuit lands 20, 21, 22 through which they extend. A wave soldering process may be used for this process, or infrared energy may be applied to melt solder. Various localized platings and flux mixtures, specific to the soldering process being used, may be applied to the substrate 12 during its fabrication or preparation. First drive wire 24 and second drive wire 25 are soldered to "L"-shaped circuit lands 20, and common wire 26 is soldered to "T"-shaped circuit land 22. Each rectangular circuit land 21 connects a lead 28 of an LED package 18 with another lead 28 of an adjacent diode package 18. Thus, a pair of electrical circuit paths are established between each "L"-shaped circuit land 20 and the common "T"-shaped circuit land 22, through intervening rectangular circuit lands 21 and LED packages 18.

During subsequent operation of the beacon light, electrical current is driven between the first input wire 24 and the common wire 26, and between the second input wire 25 and the common wire 26. In a preferred version of the invention, the LED packages 18 in a first column 32 and in a second column 34, all of which are electrically connected to first drive wire 24 are driven by a first driver circuit (not shown), while the LED packages in a third column 36 and in a fourth column 38, all of which are electrically connected to second drive wire 25 are driven by a second driver circuit (also not shown). To control the heating of the LED packages, and to conserve electrical energy, the first and second driver circuits may switch current flowing through the LED packages off and on at a frequency fast enough to assure that all the LED packages 18 appear to a human observer to be constantly turned on. Using separate driver circuits and separate circuits of LED packages, provides a degree of redundance allowing continued operation in the event of various types of failures.

FIG. 3 is an exploded isometric view of an intermediate assembly 40 including the flexible circuit board assembly 10 and an insulating housing 42. In the process of forming this assembly, the flexible circuit board assembly 10 is formed into a cylindrical shape, into which the insulating housing 42 is inserted, or the flexible circuit board assembly 10 is otherwise wrapped around the insulating housing 42. The insulating housing 42 includes a number of slots 44, into which leads 28 from LED packages 18 extend when the circuit board assembly 10 is assembled onto the housing 42, and holes (not shown), through which wires 24, 25, 26 pass. The flexible circuit board assembly 10 is fastened in place over the housing 42 by means of rivets 46 extending through mounting holes 30 in the substrate 12 of circuit board assembly 10, and through attachment holes 48 in the housing 42. In order to hold the flexible circuit board flat along its longitudinal edges 50, a curved clamping plate 52 may also be held in place by rivets 46, extending additionally through mounting holes 54 therein. The insulating housing 42 also includes a threaded end portion 56 for attachment to a base.

FIG. 4 is an isometric view of a beacon light 60 including, as a light source, the intermediate assembly 40 described above in reference to FIGS. 1–3. This assembly 40 is attached to a base 62 by means of the threaded end portion 56 (shown in FIG. 3). The base 62 is additionally fastened to a transparent cover 64, extending around and over the intermediate assembly 40, and to a mounting pipe 66, which extends upward from the ground or from another structure. The transparent cover 64 is composed of a transparent material, such as glass or thermoplastic, which is optically clear, or which, being colored, transmits light at the particular frequency of the output from the LED packages 18.

Figure 5:
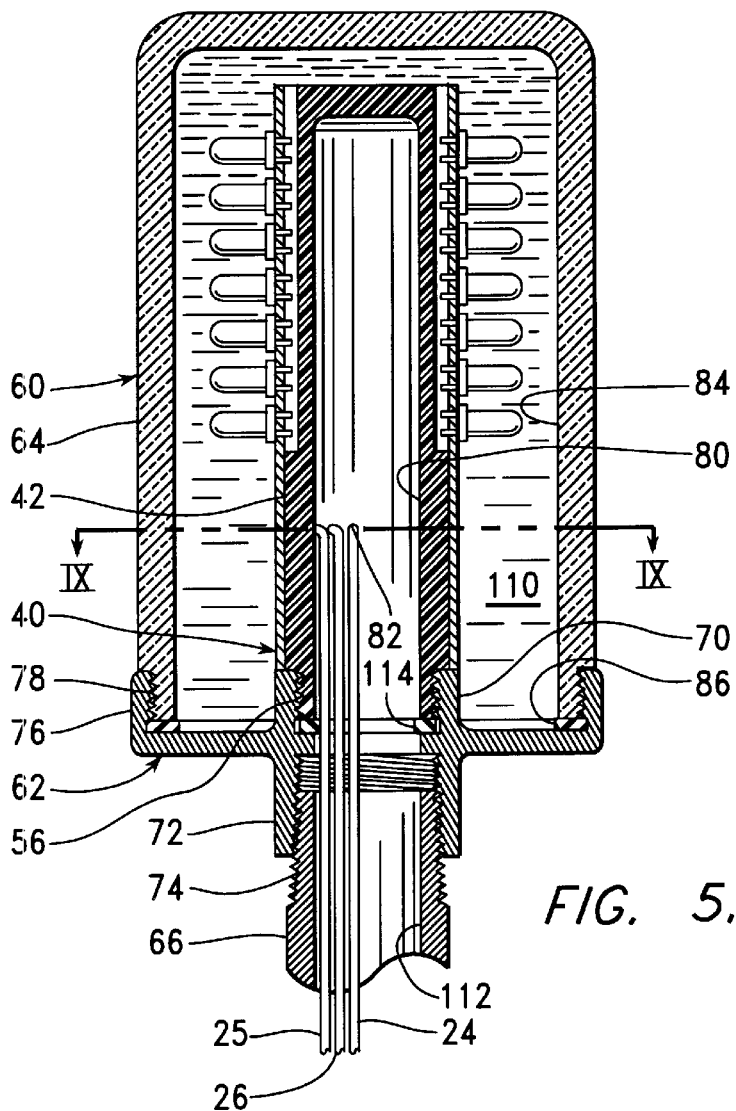
FIG. 5 is a longitudinal cross-sectional view of the beacon light of FIG. 4, taken as indicated by section lines V—V in FIG. 4.

FIG. 5 is a longitudinal cross-sectional elevation of the beacon light 60, taken as indicated by section lines V—V in FIG. 4, to reveal various internal details thereof. For example, base 62 includes an inner upward-extending, internally threaded portion 70, which engages the externally-threaded portion 56 of housing 42. The base 62 also includes a downward-extending portion 72, having an internal tapered pipe thread engaging an external pipe thread 74 of mounting pipe 66, and an outer upward-extending internally threaded portion 76 engaging a threaded end 78 of transparent cover 64. The insulating housing 42 includes an internal cavity 80, into which wires 24, 25, 26 are fed through holes 82. These wires 24, 25, 25 extend downward through mounting pipe 66 to an electrical power source (not shown).

In many applications for beacon lights, sealing the light source from ambient air is particularly important. For example, beacon lights are often used along waterways, in locations where a salt spray may cause corrosion of various conductive elements within the light. In many locations and climatic conditions, an accumulation of moisture within the transparent cover 64 can be expected to change the optical properties of the inner surface 84 of the transparent cover 64. Thus, an elastomeric annular gasket 86 is provided to effect a moisture-tight seal, with this gasket 86 being clamped as the transparent cover 64 is screwed onto the base 64. The entry of moisture or other contamination from the air surrounding the beacon light is further prevented by using tapered pipe threads within the downward-extending portion 72 of base 62 and at the end of mounting pipe 66. Various types of sealing compounds, well known to those skilled in the art of plumbing, may be used to further seal these threads against the leakage of moisture.

Figure 6:
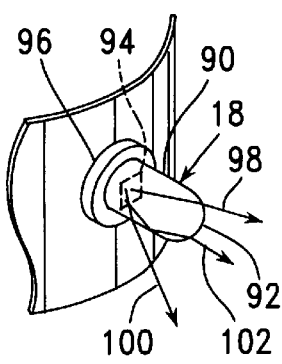
FIG. 6 is an isometric view of an LED package of the circuit board assembly of FIG. 1.

FIG. 6 is an isometric view of a single LED package 18, which includes a transparent cylindrical portion 90 extending outward to a hemispherical end portion 92. Thus, the cylindrical and hemispherical portions have an optical axis extending outward from the base. 96. Within the LED package 18, light is emitted from a light source 94, near the base 96. Some of the light emitted by the light source 94 travels directly through cylindrical portion 90 and hemispherical end portion 92, being refracted as it leaves the surface of hemispherical end portion 92, as shown by arrow 98. Another portion of the light emitted by the light source 94 travels outward from the surface of cylindrical portion 90, being refracted as shown by arrow 100. Yet another portion of the light from the light source 94 is internally reflected from the surface of cylindrical portion 90 to be refracted as it leaves the surface of hemispherical end portion 92, as indicated by arrow 102. When the LED package 18 is viewed during its operation, both light source 94 and hemispherical end surface 92 appear to glow.

In a preferred version of the present invention, the columns of LED packages 18, such as columns 32, 34, 36, and 38 (shown in FIG. 1), are angularly spaced far enough apart to allow an observer to see both the hemispherical end portions 92 and the sides of cylindrical portions 90 of various LED packages 18. While the example of FIGS. 1–5 shows the columns 32, 34, 36, and 38 of LED packages 18 being spaced apart by 90-degree angles, this effect may also be achieved within the scope of the present invention using closer column spacings.

On the other hand, the prior art devices of U.S. Pat. No. 5,224,773 to Arimura include diodes positioned as close as practical to one another, extending radially outward in a ring, so that an observer can see only the light emitted through the hemispherical ends of the LED packages. Thus, the relatively wide angular spacing of the diodes of the present invention provides an advantage over the prior art, allowing the observer to see more of the light emitted by an individual LED packages, while increasing the number of apparent points of light provided by various of the individual LED packages. With the present design, similar effects can be produced using fewer LED packages.

In a typical beacon light application, the intended observer of the light is expected to vary his portion along a relatively flat surface, such as a waterway, a roadway, or the ground in most locations. Thus, while his angle relative to the beacon light is expected to vary greatly (for example, he may be expected to view the beacon light from any angle around a full circle), his altitude or height relative to the beacon light is not expected to vary significantly. Therefore, the light transmitted through the sides of cylindrical portions 90 to travel at a generally vertically oriented angle is not expected to have the beneficial potential of light emitted through the sides of cylindrical portions 90 to travel at a generally horizontally oriented angle. For this reason, the LED packages 18 of a preferred version of the present invention are spaced much more closely in a vertical direction than in a horizontal (or circumferential) direction.

Figure 7:
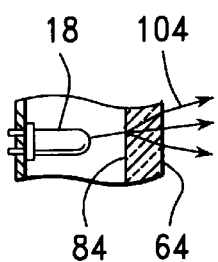
FIG. 7 is a partial longitudinal cross-sectional view of the beacon light of FIG. 4, showing the scattering of light striking a roughened internal surface of a transparent cover.
Figure 8:
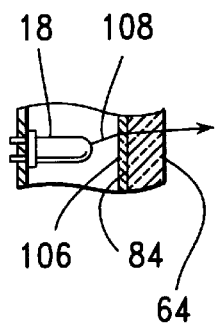
FIG. 8 is a partial longitudinal cross-sectional view of the beacon light of FIG. 4, showing the redirection of light through a fresnel lens at an internal surface of a transparent cover.

The appearance of the light emitted from the beacon light is modified in a number of ways, of which FIGS. 7 and 8 are exemplary. Each of these figures is a fragmentary sectional elevation, taken as the longitudinal elevation of FIG. 5, to demonstrate how the transmission of light is affected by coating the inner surface 84 of transparent cover 64, or by attaching a layer having a specific surface pattern thereto.

Thus, referring to FIG. 7, the inner surface 84 of transparent cover 64 may be made diffuse, or roughened, in a number of ways. For example, a suitable coating may be sprayed into the cover 64. If the cover 64 is composed of glass, the inner surface 84 may be chemically etched to provide a "frosted" surface. If the cover 64 is composed of thermoplastic, the inner surface 84 may be molded over a roughened mold surface, of the inner surface 84 may be roughened with sandpaper after molding. In any case, light from each LED package 18 is diffused when it strikes the roughened inner surface 84, being scattered through a wide angle, as depicted by arrows 104. This effect makes the cover 64 appear to glow, supplementing or even supplanting the spots of light emanating from each individual LED 18.

Referring to FIG. 8, a thin transparent sheet 106 having a number of circumferentially-extending ridges forming the triangular steps of a fresnel lens may be applied to the inner surface 84 of transparent cover 64, in the manner generally described in U.S. Pat. No. 5,224,773 to Arimura. These small steps in a surface of the transparent sheet 106 are preferably aligned with the LED packages 18 in such a way that light emitted by each LED package 18 is refracted to radiate outward, as nearly as possible, along a horizontal plane, as depicted by arrow 108.

A determination to use one of the versions of the present invention is preferably based on the intended purpose for the beacon light and on the environment in which it is to be used. While the version of FIG. 5, having a smooth inner surface 84, or the version of FIG. 8, having a fresnel structure, can be expected to produce a higher light output at a distant viewing position, as seen in an otherwise dark area, the version of FIG. 7, having a diffuse surface can be expected to have a larger illuminated area, which is therefore more easily recognized in an environment having a number of different kinds of lights.

Referring again to FIG. 5, in many applications of the beacon light 60, it is particularly desirable to provide a light which is visible from a long distance. Also, it is often particularly difficult to replace failing components of the lighting system. A light in such an application is typically powered by a battery unit, which is in turn charged using an array of solar cells. The use of recently-developed high-output LED packages promotes the use of the present invention in such applications. However, it is often very desirable to provide cooling for the operating LED packages beyond the level of ambient cooling conventionally provided. To this end, in a version of the present invention, a non-corrosive, visibly transparent fluid 110 is introduced into the space between intermediate assembly 40 and the outer structure formed by transparent cover 64. This fluid 110 is preferably visually clear or colored to transmit the frequency of light emitted by the LED packages 18.

Examples of fluids suitable for this purpose are found in the class of materials commonly known as transformer oils, such as the products sold by the Exxon Corporation under the trade name Univolt 60. Among these products, the particular oil sold by Exxon as N61 is an example having suitable optical clarity. UV-stabilizing compounds may be added to some oils of this general type to reduce a tendency to discolor with exposure to sunlight.

Leakage of this fluid 110 outward between the transparent cover 64 and the base 62 is prevented by the outer annular gasket 86, while leakage of this fluid 110 into the hole 112 extending through mounting pipe 66 is prevented by an inner annular gasket 114, which is compressed as the intermediate assembly 40 is screwed into the upward-extending, internally-threaded portion 70 of base 62.

One of the advantages of the configuration described above is that the same unit can be used with or without the cooling fluid. That is, the cooling fluid may be added in situations where illumination power requirements indicate a need for additional cooling. However, when a light-diffusing coating, as described above in reference to FIG. 7, or a fresnel lens, as discussed above in reference to FIG. 8, is required in a unit having cooling fluid, such a coating or lens prism may need to be placed on the outer surface of transparent cover 64, instead of on its inner surface, as described above. This change may be required to permit achievement of the desired effect with the coating or lens prism, due to a similarity between the index of refraction of the cooling fluid and that of the material in the coating or lens prism.

Figure 9:
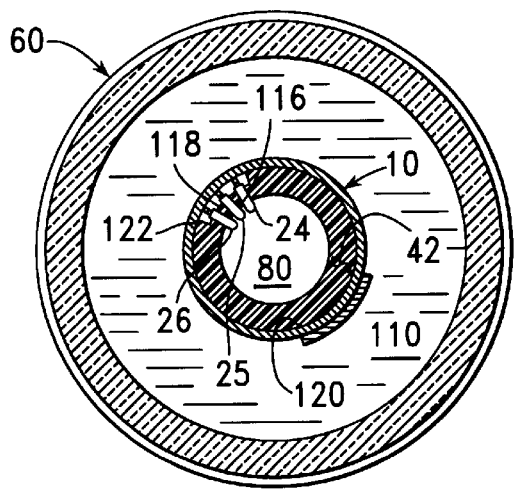
FIG. 9 is a transverse cross-sectional view of the beacon light of FIG. 4, taken as indicated by section lines IX—IX in FIG. 5.

FIG. 9 is a transverse cross-sectional view of the beacon light 60, taken as indicated by section lines IX—IX in FIG. 5 to show the provisions made in the insulating housing 42 for the insertion of wires 24, 25, 26 from flexible circuit board assembly 10 into the interior cavity 80 of housing 42. Within the housing 42, each wire 24, 25, 26 extends through a hole 116 between an exterior cavity 118 and the interior cavity 80. The exterior cavity 118 is provided to accommodate the solder connection made between each wire 24, 25, 26 and the circuit lands 20, 22 (shown in FIG. 2) of the flexible circuit board assembly 10.

As previously described in reference to FIG. 3, the slots 44 in the housing 42 similarly provide for the leads 28 extending inward from each LED package 18. In this way, the flexible circuit board assembly 10 is further allowed to wrap tightly around the housing 42.

Preferably, these provisions are sufficient to prevent leakage of the fluid 110 into internal cavity 80, due to unobstructed contact between the inner surface 120 of flexible substrate 10 and outer surface 122 of housing 42. If necessary, an elastomeric coating may be placed in an annular region along the outer surface 122 around each exterior cavity 118, or an RTV (Room Temperature Vulcanizing) compound may be applied to seal the space between each wire 24, 25, 26 and the hole 116 through which it passes.

Referring again to FIGS. 1 and 2, the ability of the beacon light 60, discussed above with particular reference to FIG. 5, to cool the diode packages 18 is further enhanced by the particular configuration of the conductive circuit lands 20, 21, 22, to which the leads 28 of LED packages 18 are soldered. The area of each of these conductive circuit leads is much larger than that which would be required for the basic purpose of conducting electrical current at the levels required by the LED packages 18. Heat from these leads 28, which extend within the LED packages 18 to the light emitting and power consuming elements thereof, is transferred along the conductive circuit lands 20, 21, 22, through the insulating portion of the flexible substrate 12, into the outer conductive layer 14 of the flexible substrate. Since it is relatively difficult to transfer heat through the insulation portion of the substrate 12, the increased area of the enlarged circuit lands 20, 21, and 22 significantly increases the rate at which heat transfer occurs. From the outer conductive layer 14, heat is removed through the fluid 110, to be transferred to the atmosphere surrounding the beacon light through the transparent cover 60 and the base 62.

Figure 10:
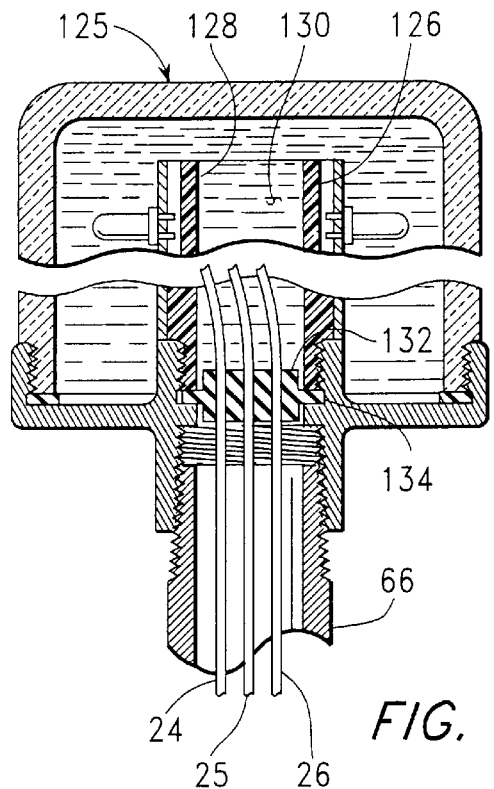
FIG. 10 is a partial cross-sectional view of an alternative version of the beacon light of FIG. 4, also taken as indicated by section lines V—V in FIG. 4.

FIG. 10 is a fragmentary longitudinal cross-sectional view of a beacon light 125 having alternative interior features. In FIG. 10, items which are identical to corresponding items in FIG. 5 are referenced with common numerals. The upper end of an insulating housing 126 is provided with an opening 128, allowing the fluid 110 to fill an interior cavity 130. Sealing between the interior cavity 130 and the mounting pipe 66 is provided by an elastomeric grommet 132, through which the wires 24, 25, 26 extend. The grommet 132 includes a flange portion 134 which is clamped as the housing 126 is screwed into the base 62.

Figure 12:
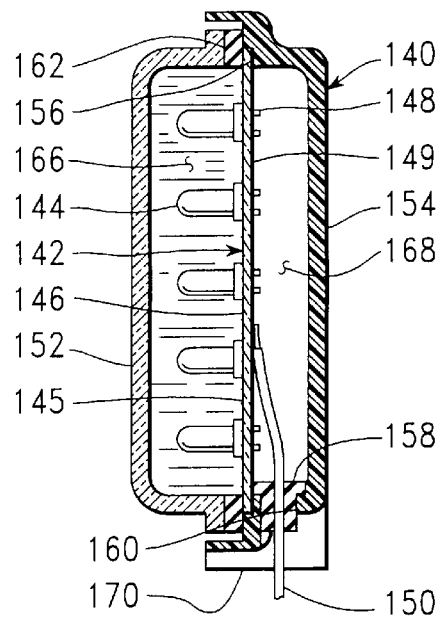
FIG. 12 is a longitudinal cross-sectional view of the display light of FIG. 11, taken as indicated by section lines XII—XII in FIG. 11.
Figure 11:
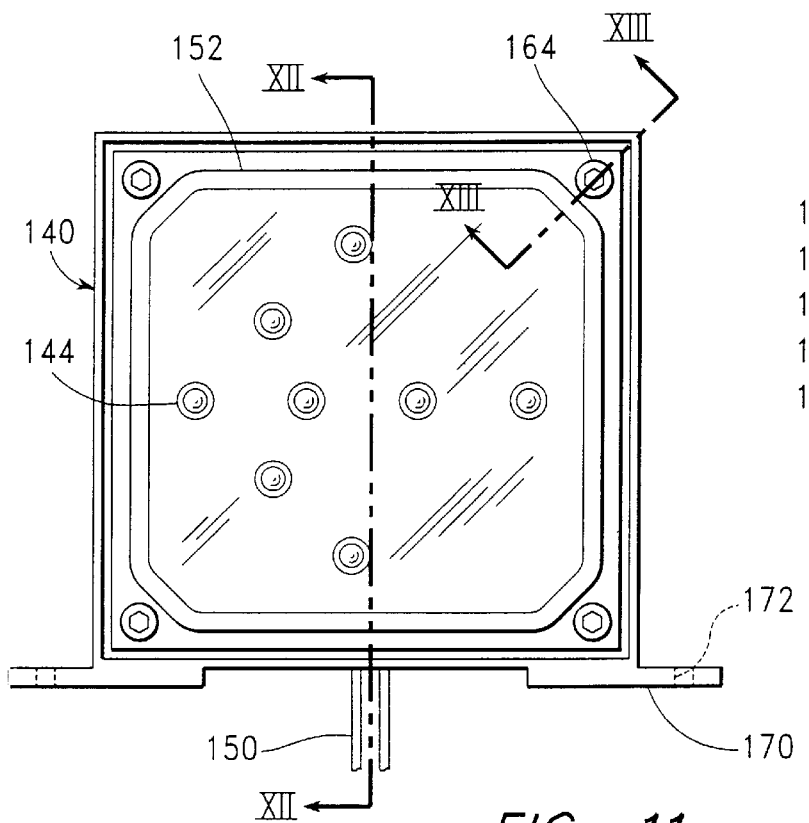
FIG. 11 is a front elevational view of a display light built in accordance with an alternative embodiment of the present invention.
Figure 13:
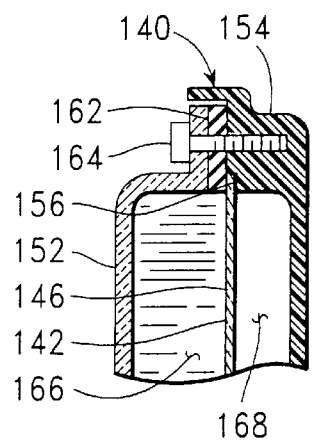
FIG. 13 is a partial cross-sectional view of the display light of FIG. 11, taken as indicated by section lines XIII—XIII in FIG. 12 to show corner attachment details.

An alternative embodiment of the present invention will now be discussed with particular reference to FIGS. 11–15. This embodiment is shown in the form of an illuminated display beacon 140. While the cylindrical beacon light 60, previously discussed with reference to FIGS. 1–10, is arranged to be visible from a wide angle (even from a 360-degree angle), the display beacon 140 is arrange to be visible from a preferred direction. For example, the display beacon 140 may be placed at the side of a road to be visible from vehicles approaching in one direction along the road. Also, while the beacon light 60 conveys a particular message based on the color of light and on the continuous of flashing nature of its timing, the display beacon 140 also displays a message by the spatial configuration of its LED packages. In the example of FIGS. 11–15, this message is in the form of a leftward-pointing arrow. FIG. 11 is a front elevational view of the display beacon 140, while FIG. 12 is a vertical cross-sectional view taken as indicated by section lines XII—XII in FIG. 11. FIG. 13 is a partial cross-sectional view taken as indicated by section lines XIII—XIII in FIG. 11 to show how various elements within the display light 140 are fastened together.

Referring first to FIGS. 11–13, the display beacon 140 includes a printed cirucit board assembly 142 having a number of LED packages 144, extending from the front surface 145 of a substrate 146, arranged to display points of a coherent image, such as a leftward-pointing arrow. That is, the LED packages 144 are arranged into a pattern, or coherent image, having an overall recognizable and meaningful shape. Since the printed circuit board assembly remains flat, instead of being curved into a cylindrical shape in the manner described in reference to FIG. 3, this printed circuit board assembly 142 is formed with a rigid substrate 146. The various leads 148 of LED packages 144 are soldered to conductive circuit lands (not shown) on the rear surface 149 of substrate 146, in the general manner previously described in reference to FIG. 2. The number of individual circuits having LED packages in series depends on the complexity of the message to be presented, on the type of LED package used, and on the desired operating voltage. In this example, eight LED packages can be wired in series to be electrically driven through a single pair of wires 150, each of which is soldered to a conductive circuit land on the rear surface 149 of substrate 146.

The LED packages 144 are visible through a transparent cover 152, which is optically clear or highly transmissive in a frequency range including the frequency of light emitted by the LED packages 144. The transparent cover 152 may be composed of glass or of a thermoplastic material. A rear housing 154 extends behind the circuit board assembly 142. The circuit assembly 142 is placed within a cavity 156 of the rear housing 154, with the wires 150 extending downward within an elastomeric grommet 158, through a hole 160 in the housing 154, and an elastomeric gasket 162 is placed over the edges of the circuit board assembly 142. The cover 152 is placed over the gasket 162, being held in place by four corner mounting screws 164. As these screws 164 are tightened, the elastomeric gasket 162 is pressed against the adjacent surfaces of both circuit board 142 and rear housing 154, sealing a front cavity 166, extending between the circuit board 142 and transparent cover 152, from a rear cavity 168, extending between the circuit board 142 and rear housing 154, and sealing both of these cavities 166 and 168 from the atmosphere outside the display light 140. Rear housing 154 also includes a mounting foot 170, extending from each side to provide a mounting hole 172 for fastening to the top of a horizontal surface.

In one version of this embodiment, the front cavity 166 is filled with an optically clear fluid, which provides the advantages discussed above in reference to FIG. 5, relative to cooling the LED packages 144. As previously described in reference to FIG. 5, the fluid may be, for example, a transformer oil, such as one of the products sold by the Exxon Corporation under the trade name Univolt 60. This cooling fluid can be added without changing other components of the device.

FIG. 14 is an isometric view of warning system 175, including the display light 140, a power supply 176, and a foldable, portable barricade 178. This system is used, for example, to warn oncoming motorists of a temporary road hazard, indicating that they should drive to the left of the barricade 178.

The power supply 176 includes a number of batteries 180, which are electrically connected to drive the LED packages 144 within the display light 140. Each of a pair of sloped sides 182, 183 includes a solar panel 184 having a number of photovoltaic cells 186, generating electrical current during exposure to sunlight. This current is used to maintain the batteries 180 in a charged condition. Various types of well-known circuits may be used to control the charging of the batteries 180. For optimum generation of electrical energy from solar energy, each sloped side 182, 183 is inclined at an angle between 35 degrees and 75 degrees with the horizontal.

In this way, solar panels are provided without requiring their placement at any particular orientation with respect to the passing sun. With some orientations, one of the panels 184 on sloped sides 182, 183 is illuminated by direct sunlight during the morning, while the other such panel is illuminated by direct sunlight during the afternoon. With other orientations, only one of the panels 184 on sloped sides 182, 183 is illuminated by direct sum, but this occurs during the entire day. Both such types of orientations allow proper operation of the power supply 176. Therefore, the warning system 175 can be aligned to warn oncoming motorists of a hazard, without regard for its angle with respect to the sun, and with the display light 140 being fastened to the power supply 176 by a pair of mounting bolts 188 extending through holes 172 (shown in FIG. 11), without a provision for adjusting the orientation of the display light 140 with respect to the panels 182, 183.

The outputs of batteries 180 are directed to a driving circuit 189, which controls the operation of the LED packages 144. For example, current may be supplied to the LED packages 144 in the form of repeated pulses, since flashing lights are used particularly to warn of danger. The LED packages 144 may also be flashed at a much faster rate, not noticeable by a human observer, to regulate the average power being used by each LED package 144, so that overheating does not occur. Alternately or additionally, resistors may be used to regulate the flow of current through the LED packages 144.

The power supply 176 also includes a threaded shaft 190 extending outward to form an attachment point for the folding barricade 178. The shaft 190 also forms a pivot point for a front leg assembly 192 and a rear leg assembly 194 of the barricade 178. Thus, the power supply 176, and the barricade leg assemblies 192, 194 are clamped in a desired orientation by tightening a nut 196 on the threaded shaft 190.

FIG. 15 is an isometric view of the display light 140 similarly mounted on an alternate power supply box 198, which includes a replaceable battery (not shown). This type of system is operated by replacing batteries, rather than by recharging with solar energy. An outward extending threaded shaft 200 is provided, so that the power supply box 198 can be mounted on a folding barricade 178 as described above in reference to FIG. 14.

While the display light 140 has been described in operation with a power supply 176 including solar panels 184 and rechargeable batteries, or with a replaceable battery, it is understood that similar provisions can readily be made to provide electrical power for the beacon light 60 shown in FIG. 4.

While the invention has been described in its preferred forms or embodiments with some degree of particularity, it is understood that this description has been given only by way of example and that numerous changes in the details of construction, fabrication and use, including the combination and arrangement of parts, may be made without departing from the spirit and scope of the invention.

What is claimed is:

1. A lighting unit comprising:

a circuit board assembly having an insulating substrate with an outer side and an inner side opposite said outer side, and a plurality of conductive circuit lands extending along said inner side;

a plurality of LED packages mounted on said outer side, with leads extending through holes in said insulating substrate and individually soldered to said conductive circuit lands, wherein each LED package within said plurality thereof includes a light-emitting segment in a base portion, a light transmitting portion extending from said base portion along an optical axis of said LED package, and a lens portion at an end of said light transmitting portion to direct light from said light-emitting segment away from said LED package, and wherein each said LED package is mounted with said optical axis thereof extending outward from said outer side and perpendicular thereto;

a transparent cover extending outwardly adjacent said LED packages, wherein a first cavity between said transparent cover and said LED packages is sealed from ambient air;

a housing extending from said inner side, with said circuit board assembly being attached to said housing and supported thereby, wherein a second cavity within said housing is sealed from ambient air, wherein said housing has a generally cylindrical outer surface extending between first and second ends thereof, and a generally cylindrical inner surface, coaxial with said generally cylindrical outer surface, extending around said second cavity, wherein said insulating substrate is flexible and is curved around said generally cylindrical outer surface, with said optical axis of each said LED package extending radially outward from said outer surface; and a plurality of circuit wires individually attached to various of said circuit lands and extending outward through a hole in said housing; and, a base extending outward from said first end of said housing, with said first end of said housing being attached to said base; wherein said transparent cover has a cylindrical cover portion extending around said circuit board assembly and said plurality of LED packages from a peripheral portion of said base, and an end cover portion extending across said second end of said housing, wherein said base includes an outer threaded portion, wherein said transparent cover includes a threaded surface at a first end thereof engaging said outer threaded portion, wherein said lighting unit includes a first gasket which is compressed as said threaded surface at said first end of said transparent cover is screwed into engagement with said outer threaded portion, and wherein said end cover portion extends across a second end of said transparent cover, said second end thereof being opposite said first end thereof, as an integral portion of said transparent cover.

2. The lighting unit of claim 1:

wherein said base includes an inner threaded portion;

wherein said housing includes a threaded surface at said first end thereof engaging said inner threaded portion; and wherein said lighting unit includes a second gasket which is compressed as said threaded surface at said first end of said housing is screwed into engagement with said inner threaded portion.

3. The lighting unit of claim 1, wherein said first cavity is filled with a transparent cooling fluid.

4. The lighting unit of claim 3, wherein said transparent cooling fluid is a transformer oil.

* * * * *